United States Patent [19]

McElroy

[11] 4,443,864
[45] * Apr. 17, 1984

[54] MEMORY SYSTEM FOR MICROPROCESSOR WITH MULTIPLEXED ADDRESS/DATA BUS

[75] Inventor: David J. McElroy, Houston, Tex.

[73] Assignee: Texas Instruments Incorporated, Dallas, Tex.

[*] Notice: The portion of the term of this patent subsequent to Dec. 15, 1998 has been disclaimed.

[21] Appl. No.: 310,014

[22] Filed: Oct. 13, 1981

Related U.S. Application Data

[63] Continuation of Ser. No. 83,122, Oct. 9, 1979, Pat. No. 4,306,298.

[51] Int. Cl.³ .............................................. G06F 11/00
[52] U.S. Cl. ...................................... 364/900; 365/230
[58] Field of Search ... 364/200 MS File, 900 MS File; 365/230

[56] References Cited

U.S. PATENT DOCUMENTS

| | | | |
|---|---|---|---|
| 3,686,640 | 8/1972 | Anderson et al. | 364/900 |
| 3,965,459 | 6/1976 | Spencer et al. | 365/230 |
| 3,967,251 | 6/1976 | Levine | 364/200 |
| 4,091,456 | 5/1978 | Ehresman et al. | 364/900 |

Primary Examiner—Raulfe B. Zache
Attorney, Agent, or Firm—John G. Graham

[57] ABSTRACT

A memory system for a digital processor device having a 16-bit bidirectional bus with multiplexed addresses and data employs separate memory devices for the high order and low order data bytes. When less than 64K words of memory are used, there are unused address lines in the bus. A microcomputer may use memory devices partitioned 4K×8, needing 12 address pins. Both devices are constructed the same, but one accesses the low order byte and the other the high order byte under control of a single byte-select terminal. Mapping of the bus to memory device connections and internal connection of unused pins to address inputs or data input/output lines within the memory devices, along with the byte-select function, allow a single type of device to function in either position.

16 Claims, 2 Drawing Figures

MEMORY SYSTEM FOR MICROPROCESSOR WITH MULTIPLEXED ADDRESS/DATA BUS

This is a continuation of application Ser. No. 083,122, filed Oct. 9, 1979, now U.S. Pat. No. 4,306,298.

BACKGROUND OF THE INVENTION

This invention relates to memory for small computer systems, and more particularly to memory devices for use with such systems having a multiplexed bidirectional address and data bus.

Microcomputer boards or other equipment using microprocessors usually employ small memory systems. A 16-bit microprocessor has a 16-bit data word which can address up to $2^{16}$ or 64K words of memory, but this amount is often not required. The semiconductor industry thus supplies memory parts that are partitioned, for example, as 4K×8 for microprocessor customers instead of the 32K×1 devices it supplies to mainframe customers. When used with a multiplexed address/data bus, such a system will use all sixteen lines for data but less than sixteen for addressing. The data on the sixteen lines will include an 8-bit low order byte and an 8-bit high order byte; usually one "×8" memory device or package for the low order byte and another for the high order byte. The economics of large volume, low cost manufacture of semiconductor memory dictate that the number of different types of memory devices be kept to a minimum and that each one selected for manufacture be used in very large scale. On the other hand, it is undesirable to place the burden on the user to adapt a single memory device for operation as either the high order or low order byte by complex external circuitry which he must accommodate on the board with the microprocessor and memory.

It is the principal object of this invention to provide an improved memory system for small computers, particularly microprocessors having a multiplexed address-/data bus. Another object is to provide an improved memory device which will function as the high order or low byte in a microcomputer system using a bidirectional multiplexed bus. A further object is to provide a single memory device having multiple uses.

SUMMARY OF THE INVENTION

In accordance with an embodiment of the invention, an improved memory system for a digital processor device having a 16-bit bidirectional bus with multiplexed addresses and data employs separate memory devices for the high order and low order data bytes. When less than 64K words of memory are used, there are unused address lines in the bus. A microcomputer may use memory devices partitioned 4K×8, needing 12 address pins. Both devices are constructed the same, but one accesses the low order byte and the other the high order byte under control of a single byte-select terminal. Mapping of the bus to memory device connections and internal connection of unused pins to address inputs or data input/output lines within the memory devices, along with the byte-select function, allow a single type of device to function in either position.

The memory device constructed according to the invention may be used also in 8-bit microprocessor systems, so one device with standard pin-out has multiple uses. The memory device may be an EPROM, ROM, static RAM, or dynamic RAM; indeed, an entire family of memory devices of all these types and different partitioning may be made using the same pin-out or compatible pin-out.

BRIEF DESCRIPTION OF THE DRAWINGS

The novel features believed characteristic of the invention are set forth in the appended claims. The invention itself, however, as well as other features and advantages thereof, will be best understood by refernece to the detailed description which follows, read in conjunction with the accompanying drawings, wherein:

DETAILED DESCRIPTION OF SPECIFIC EMBODIMENT

Figure 1:
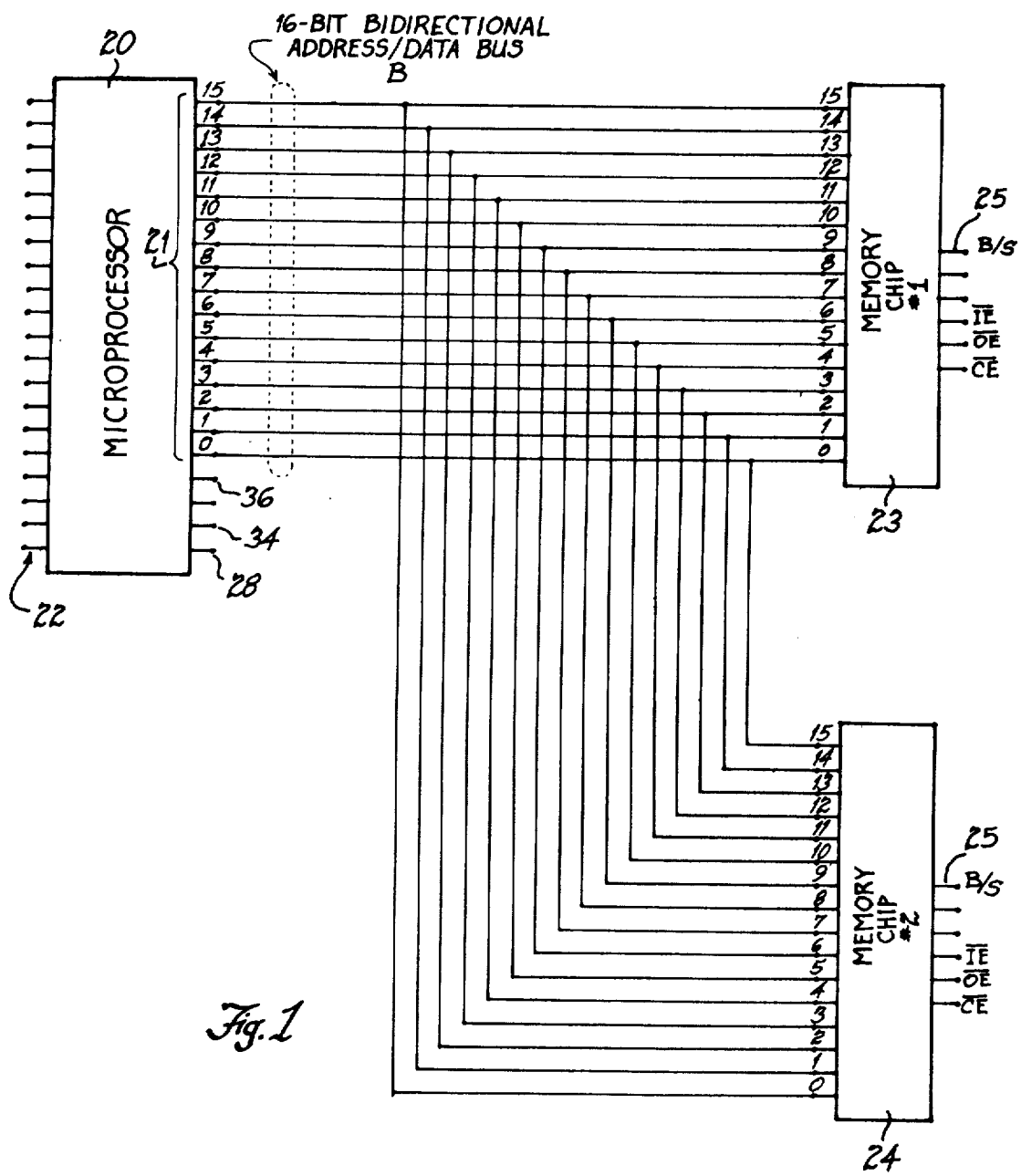
FIG. 1 is an electrical diagram in block and schematic form of a microcomputer system employing the features of the invention.

With reference to FIG. 1, a portion of a processor system is shown which may use the dual purpose memory chips of the invention. In this example, the system includes a microprocessor 20 or other type of CPU that may have one or more than one semiconductor chip. The microprocessor 20 uses in this case a 16-bit bidirectional I/O bus B which is connected to sixteen I/O pins 21 labelled 0-15; the bus contains sixteen lines or conductors on a processor board in a typical construction. The CPU is capable of sending out a 16-bit address on the bus B, and a 16-bit data word is received by the CPU from the system memory on the bus B in response to the address, in a typical read cycle. In like manner, in a write cycle the CPU sends out an address on the bus B via pins 21 then sends out a 16-bit data word on the bus B for writing into the defined location in the memory. This operation is conventional and is used in many different types of microprocessors and other small CPU devices. Other pins 22 on the microprocessor are not pertinent to this invention and define power supplies, control functions such as Wait, Memory Busy, Interrupt, etc., as is conventional.

The system memory may contain up to $2^{16}$ or 64K data words which can be directly accessed by the 16-bit address bus B. In a small system of less than 64K words, the high order address bits are not used. For example, a 64K bit memory in this system would be 16 bits wide by 4K deep, providing 4K words of storage and requiring only a 12-bit address. It is the small memory of this type that can best use the concepts of the invention. Here pins 12-15 or lines 12-15 in the bus B are not used for address because only a 12-bit address is needed.

According to the invention, a memory device is adapted for use in small memory system of the type employed in microcomputer boards. As will be explained, the memory device may be a read/write memory such as a dynamic or static RAM, or a read-only device such as a ROM or EPROM. The device in one example has a 12-bit address input and an 8-bit data I/O port. Thus two of the devices are needed for a 16-bit bidirectional bus type of microcomputer system, one for the eight low order data bits 0-7 and another for the eight high order data bits 8-15. Together the two devices appear to the CPU as if a single 16-bit wide memory is connected to the bus. In order to avoid the necessity of manufacture of two different types of memory devices, one for low order data bits and another for high order data bits, a single device is made to be selectively commanded to perform in either position. Furthermore, the same device can be used in a system having an 8-bit data I/O port instead of 16-bit.

In FIG. 1, a pair of identical memory chips 23 and 24 are shown connected to the 16-bit bidirectional bus B. These memory chips are constructed exactly the same, but one of them has a logic "0" on byte select pin 25 while the other has a logic "1" on its byte select pin 25. The memory device 23 has its pins 0-11 connected directly to lines 0-11 of the bus B; pins 0-7 function as a data I/O or output port (the low order byte for the CPU 20) and pins 0-11 functions as address inputs. Pins 12-15 are nonfunctional for the device 23. A logic "0" is connected to the byte select pin 25 of the chip 23 by soldering this pin to a Vss conductor on the processor board. The memory device 24, on the other hand, has its byte select pin 25 soldered to Vdd and its pins 0-15 connected to the pins 0-15 of the bus B in reverse order compared to the device 23. Data output (or input) from the pins 0-7 of the memory chip 24 is connected to the high order byte (lines 15-8, respectively, of the bus B. The twelve bit address from lines 0-11 of the bus is connected to pins 15 through 4, repsectively, (i.e., in reverse order) for the chip 24. Pins 12-15 are internally mapped to the pins 3-3 within the device 24.

A chip Enable $\overline{CE}$ pin on each of the memory chips 23 and 24 is a control input to cause the chip to accept and latch in an address appearing on the bus B. An Output Enable $\overline{OE}$ pin on each of the memory chips is another control input to cause an 8-bit data output to be applied by the memory chip to certain of its pins (0-7) and thus to the appropriate low order or high order byte of the bus B. Likewise, if the device is a read/write memory, an Input Enable $\overline{IE}$ pin on each memory chip is a control input which causes the device to receive and latch in an 8-bit data byte from the bus Referring to FIG. 2, the internal structure of the memory chips 23 or 24 is shown for one example. The memory chip contains sixteen bonding pads 0-15 corresponding to its pins 0-15. These bonding pads are connected by conductors 26 to the inputs of twelve address latches 27 which are of conventional construction and function to latch the address appearing on the pins lines 26 when a Chip Enable signal $\overline{CE}$ occurs. The $\overline{CE}$ signal can be generated by the microprocessor 20 or by circuitry external to the microprocessor from an Address Output signal from the microprocessor appearing on a pin 28, for example. The outputs of the address latches are connected to row and column decoders 29 which access a memory array 30. In this example the array would contain 32,768 bits partitioned as eight groups of 32 columns by 128 rows. The decoded output (or input) 31 from each group is connected to the output of a tristate data buffer 32 which functions to maintain a high impedance output on the lines 33 until an Output Enable $\overline{OE}$ signal appears on the $\overline{OE}$ input pin of the memory device. The $\overline{OE}$ signal may be generated by the microprocessor 20 in a pin 34, or by circuitry external to the microprocessor in response to a Memory Data Input command on this pin. If the memory device is of the read-only type, then no write operation occurs. However, if the memory is of the read/write type then tristate data input buffers 35 will be included on the chip. These input buffers are activated by an Input Enable $\overline{IE}$ command on the $\overline{IE}$ pin. This command comes from a pin 36 of the microprocessor, or is generated from a Memory Data Output command on this pin. The tristate buffers are needed to avoid data outputs from being misinterpreted as addresses, etc. As thus far described, the memory chip of FIG. 2 is of known construction.

According to the invention, the bonding pads 12-15 are connected to gates 37 which function to connect these pads to the pads 0-3 so that the pins 12-15 will accept address bits and connect them via lines 38 to four of the inputs 26 of the address buffers 27. The gates 37 allow the address signals through only when the pin 25 is connected to Vdd. Address inputs are used for this internal mapping because smaller MOS transistors can be used in the gates 37 compared to what would be needed for data outputs which would have to drive the capacitive loading of the bus.

Figure 2:
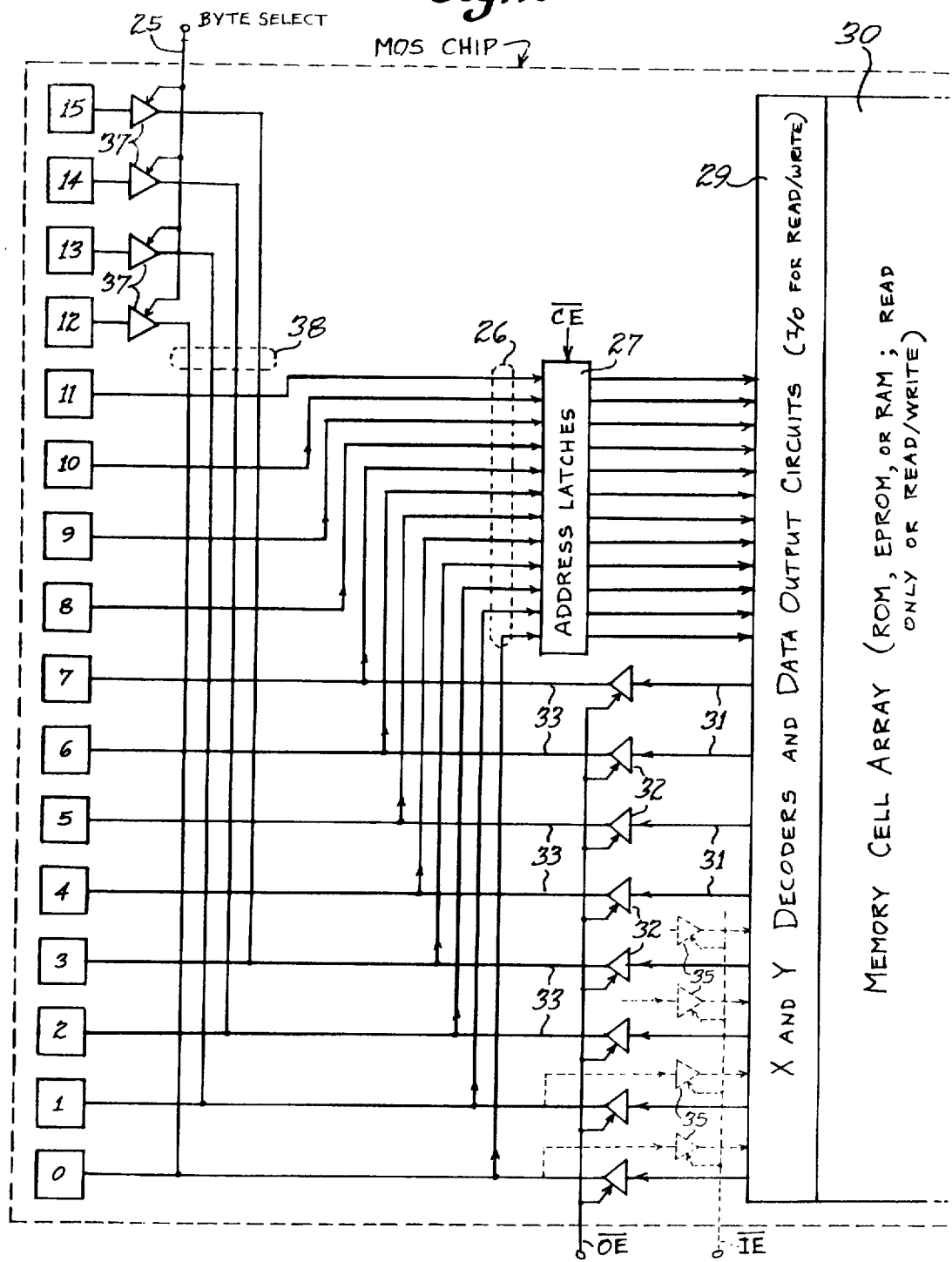
FIG. 2 is an electrical diagram in schematic form of a semiconductor memory device constructed according to the invention and used in the system of FIG. 1.

Using the arrangement of FIG. 2 in the microcomputer system of FIG. 1, it is seen that the eight output pins 0-7 of device 23 are connected to the low order byte of the bus B and the eight output pins 0-7 of the device 24 are connected to the high order byte of the bus in the order 15 through 8. The twelve address lines 0-11 of the bus are coupled to the twelve latches in somewhat mixed order, but this is immaterial so long as the convention is maintained. The mechanical or physical location of an addressed bit is not important to the CPU.

It is understood that the specific pin assignments used for multiplexing addresses and data with mapping according to the invention are merely for illustration of one embodiment; others may be employed while still utilizing the concepts of the invention.

the invention may also be used in a system having a larger memory, such as 8K words (instead of 4K words) where fourteen address bits would be needed. In such case fourteen address latches 27 (instead of twelve) would be used in the memory device of FIG. 2, and only two of the gates 37 would be used. The pins 12 and 13 of the memory device 23 or 24 would be connected directly to address buffer inputs, and only pins 14 and 15 would be connected by gates 37 to pins 0 and 1 and thus to inputs 26. Otherwise the construction would be the same.

The limiting case is a system using 64K words of memory, needing a sixteen bit address. Here no byte select input 25 is used, and no gates 37 are used. All pins 0-15 go directly to sixteen address buffers 27. The connections shown in FIG. 1 transpose low order and high order data I/O pins 0-7 for chip 24 compared to chip 23, and all sixteen address bits are transposed.

Accordingly, while this invention has been described with reference to illustrative embodiments, this description is not intended to be constructed in a limiting sense. Various mofifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A memory device comprising memory means having an M-bit address input and an 8-bit data output, where M is an integer greater than eight, the memory means accessing eight data bits to said output in response to an M-bit address on said input, the device having sixteen address/data terminals, means connecting said 8-bit data output to a selected eight of said terminals, means connecting said M-bit address input to M of said terminals which include said selected eight of said terminals, and gate means selectively connecting certain ones of said terminals to inputs of said M-bit address input.

2. A device according to claim 1 wherein the memory means includes an M-bit address latch at said input to receive the M-bit address, decoder means connected to outputs of the address latch to produce a decoded address output, and a memory array connected to receive said decoded address output and partitioned to include eight parallel data outputs, and wherein the device is a semiconductor integrated circuit.

3. A device according to claim 1 wherein said gate means is activated by a single input terminal to the device.

4. A device according to claim 3 wherein four of said selected eight of said terminals are not used for addresses when a given voltage is applied to said single input terminal.

5. A memory device comprising memeory means having an M-bit address input and an N-bit data output, where M and N are integers greater than two and M is greater than N, the memory means accessing an N-bit byte in response to an M-bit address on said input, the device having at least 2N address/data terminals, means connecting said N-bit data output to a selected subset of N of said terminals, means connecting said M-bit address input to M of said terminals which include said selected subset of N of said terminals.

6. A device according to claim 5 wherein the memory means includes an M-bit address latch at said input to receive said M-bit address, decoder means connected to outputs of the address latch to produce a decoded address output, and a memory array connected to receive said decoded address output and partitioned to include N parallel outputs, and wherein the device is a semiconductor integrated circuit.

7. A device according to claim 5 wherein the memory means is of the read/write type and includes an N-bit data input along with said N-bit data output, and the memory means includes means coupled to the data input and data output for selecting between data input and data output operations.

8. A digital processor system comprising a CPU, a multiplexed input/output bus, said CPU having a 2N-bit bidirectional data input/output port multiplexed with an M-bit address port and connected to said input/output bus, where M and N are integers greater than two and M is greater than N, a connector board having at least 2N-bit bidirectional multiplexed data/address bus connected to said input/output bus, a pair of memory devices each having 2N terminals and each having memory means with an M-bit address input and an N-bit data output, each of the memory means accessing N-bits of data in response to an M-bit address on said input, means within each memory device connecting said N-bit data output to a selected subset of N of said 2N terminals, means within each memory device connecting said M-bit address input to M of said 2N terminals including said selected subset, connecting means coupling a certain N lines of said data/address bus to said selected subset of said 2N terminals of one of said memory devices and coupling N lines of said bus different from said certain N lines to the selected subset of the other of said memory devices, M lines of said data/address bus being connected to M terminals on each of said memory devices.

9. A system according to claim 8 including conductor means within said other of the memory devices connecting some of said terminals to part of said M-bit address input of the memory means.

10. A system according to claim 9 wherein both of said memory device include said conductor means but such conductor means is inactivated in said one of the memory devices.

11. A system according to claim 10 wherein N is eight and M is twelve.

12. A system according to claim 11 wherein said conductor means includes parallel gate means activated by a given voltage on a byte select terminal on each of the memory devices.

13. A memory system for use in a digital processor system which has 2N multiplexed bidirectional access lines comprising a first and a second memory, each said memory having a plurality of terminals connected to said access lines, said terminals of each memory including an M-bit address input and an N-bit data output, where M and N are integers and M is greater than N, each said memory accessing an N-bit byte in response to an M-bit address on said input, said terminals of each said memory being the same pattern of 2N multiplexed address/data means in each said first and second memory connecting said N-bit data output to a selected subset of N of said terminals, such selected subset in the first memory being different from such selected subset of the second memory, means in each said memory connecting said M-bit address input to M of said terminals which include said selected subset of N of said terminals for such memory.

14. A system according to claim 13 where said selected subset of N of said terminals of the first memory is connected to one set of N of said access lines and said selected subset of N of said terminals of the second memory is connected to a different set of N of said access lines.

15. A digital processor system comprising:
a bidirectional multiplexed address/data bus;
a CPU having a 2N-bit bidirectional data input/output port multiplexed with an M-bit address port at CPU terminals, where M and N are integers greater than two and M is greater than N, said CPU terminals being connected to said bus,
a connector board having at least 2N-bit bidirectional multiplexed data/address lines connected to said bus, a pair of memory devices each having 2N terminals, each of the pair of memory devices having memory means with an M-bit address input and an N-bit data output, each of the memory means accessing N-bits of data in response to an M-bit address on said input, means within each memory device connecting said N-bit data output to a selected subset of N of said 2N terminals, means within each memory device connecting said M-bit address input to a different set of M of said 2N terminals including said subset, connecting means coupling N lines of said bus to said selected subset of said 2N terminals of one of said memory devices and a different N lines of said bus to the selected subset of the other of said memory devices, M lines of said bus being coupled to M of said terminals on each of said memory devices.

16. A system according to claim 15 wherein N is eight and M is at least twelve.

* * * * *